(12) United States Patent
Jeong

(10) Patent No.: US 10,811,352 B2
(45) Date of Patent: Oct. 20, 2020

(54) SEMICONDUCTOR PACKAGE

(71) Applicant: SAMSUNG ELECTRONICS CO., LTD., Suwon-si (KR)

(72) Inventor: Kwang Ok Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/405,693

(22) Filed: May 7, 2019

(65) Prior Publication Data
US 2020/0105665 A1 Apr. 2, 2020

(30) Foreign Application Priority Data

Oct. 1, 2018 (KR) .................... 10-2018-0117122

(51) Int. Cl.
*H01L 23/522* (2006.01)
*H01L 23/552* (2006.01)
(Continued)

(52) U.S. Cl.
CPC ...... *H01L 23/5226* (2013.01); *H01L 23/3128* (2013.01); *H01L 23/5223* (2013.01); *H01L 23/5283* (2013.01); *H01L 23/544* (2013.01); *H01L 23/552* (2013.01); *H01L 24/09* (2013.01); *H01L 24/17* (2013.01); *H01L 25/16* (2013.01); *H01L 28/40* (2013.01); *H01L 2223/54433* (2013.01); *H01L 2224/0231* (2013.01); *H01L 2224/02373* (2013.01); *H01L 2224/02377* (2013.01); *H01L 2224/02379* (2013.01); *H01L 2224/02381* (2013.01); *H01L 2224/0401* (2013.01)

(58) Field of Classification Search
CPC ... H01L 23/28; H01L 23/5225; H01L 23/544; H01L 23/552; H01L 23/562; H01L 2924/1811; H01L 2924/1815; H01L 2924/18161; H01L 2924/18162
See application file for complete search history.

(56) References Cited

U.S. PATENT DOCUMENTS 9,330,994 B2   5/2016  Camacho et al.
9,431,316 B2   8/2016  Pagaila
(Continued)

FOREIGN PATENT DOCUMENTS

KR   10-2018-0037406 A    4/2018

*Primary Examiner* — Thanhha S Pham
(74) *Attorney, Agent, or Firm* — Sughrue Mion, PLLC

(57) ABSTRACT

A semiconductor package includes a semiconductor chip having an active surface on which a connection pad is disposed and an inactive surface opposing the active surface; a first encapsulant covering at least a portion of each of the inactive surface and side surfaces of the semiconductor chip, and having one or more recessed portions recessed towards the inactive surface of the semiconductor chip; a metal layer disposed on the first encapsulant, and filling at least a portion of each of the recessed portions; and an interconnect structure disposed on the active surface of the semiconductor chip, and including a redistribution layer electrically connected to the connection pad. A surface of the metal layer in contact with the first encapsulant has a surface roughness greater than a surface roughness of a surface of the metal layer spaced apart from the first encapsulant.

16 Claims, 17 Drawing Sheets

(51) Int. Cl.
*H01L 23/544* (2006.01)
*H01L 23/31* (2006.01)
*H01L 23/528* (2006.01)
*H01L 25/16* (2006.01)
*H01L 23/00* (2006.01)
*H01L 49/02* (2006.01)

(56) References Cited

U.S. PATENT DOCUMENTS

2018/0096927 A1    4/2018   Kim et al.
2018/0114762 A1*   4/2018   Chiu .................. H01L 23/3128

\* cited by examiner

SEMICONDUCTOR PACKAGE

CROSS-REFERENCE TO RELATED APPLICATION(S)

This application claims benefit of priority to Korean Patent Application No. 10-2018-0117122 filed on Oct. 1, 2018 in the Korean Intellectual Property Office, the disclosure of which is incorporated herein by reference in its entirety.

BACKGROUND

The present disclosure relates to a semiconductor package, particularly a fan-out semiconductor package, for example.

As electronic devices have been designed to have reduced sizes and to implement high performance, distances between components in electronic products have been reduced, and operational speeds have been increased. However, the reduced distances between components may cause electromagnetic interference (EMI) between components, which may lead to malfunctioning of devices. Accordingly, techniques for shielding electromagnetic waves have recently been developed. In the case of a smartphone, an electromagnetic wave shielding technique has only been applied to some chips, such as a communications chip, but the technique has been increasingly applied to an application processor (AP) chip, a radiofrequency (RF) chip, and the like.

As an electromagnetic waves shielding technique, a metal can structure, or a deposition method such as sputtering method has been used. To improve electrical properties or to prevent warpage in an electronic product, materials having improved properties, such as a material having a low dielectric loss rate and a low coefficient of thermal expansion, have been used, and such materials include a large amount of internal ceramic filler, and etchability of the materials is relatively poor. Thus, when an EMI shielding layer is formed on such materials through a sputtering method, and the like, adhesive strength may decrease, and as a result, an EMI shielding layer may be lifted due to volumetric expansion of steam included in a package during a heat treatment process such as a reflow process.

SUMMARY

An aspect of the present disclosure is to provide a semiconductor package having a metal layer for shielding electromagnetic waves with improved adhesive strength. Also, a marking pattern for identification may be added to the semiconductor package.

According to an aspect of the present disclosure, a first metal layer having a surface on which roughness is formed and having a serrated pattern may be transcribed on an encapsulant, the first metal layer may be selectively etched, and a second metal layer for shielding electromagnetic waves may be formed on the encapsulant.

According to an aspect of the present disclosure, a semiconductor package includes a semiconductor chip having an active surface on which a connection pad is disposed and an inactive surface opposing the active surface; a first encapsulant covering at least a portion of each of the inactive surface and side surfaces of the semiconductor chip, and having one or more recessed portions recessed towards the inactive surface of the semiconductor chip; a metal layer disposed on the first encapsulant, and filling at least a portion of each of the recessed portions; and an interconnect structure disposed on the active surface of the semiconductor chip, and including a redistribution layer electrically connected to the connection pad. A surface of the metal layer in contact with the first encapsulant has a surface roughness greater than a surface roughness of a surface of the metal layer spaced apart from the first encapsulant.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
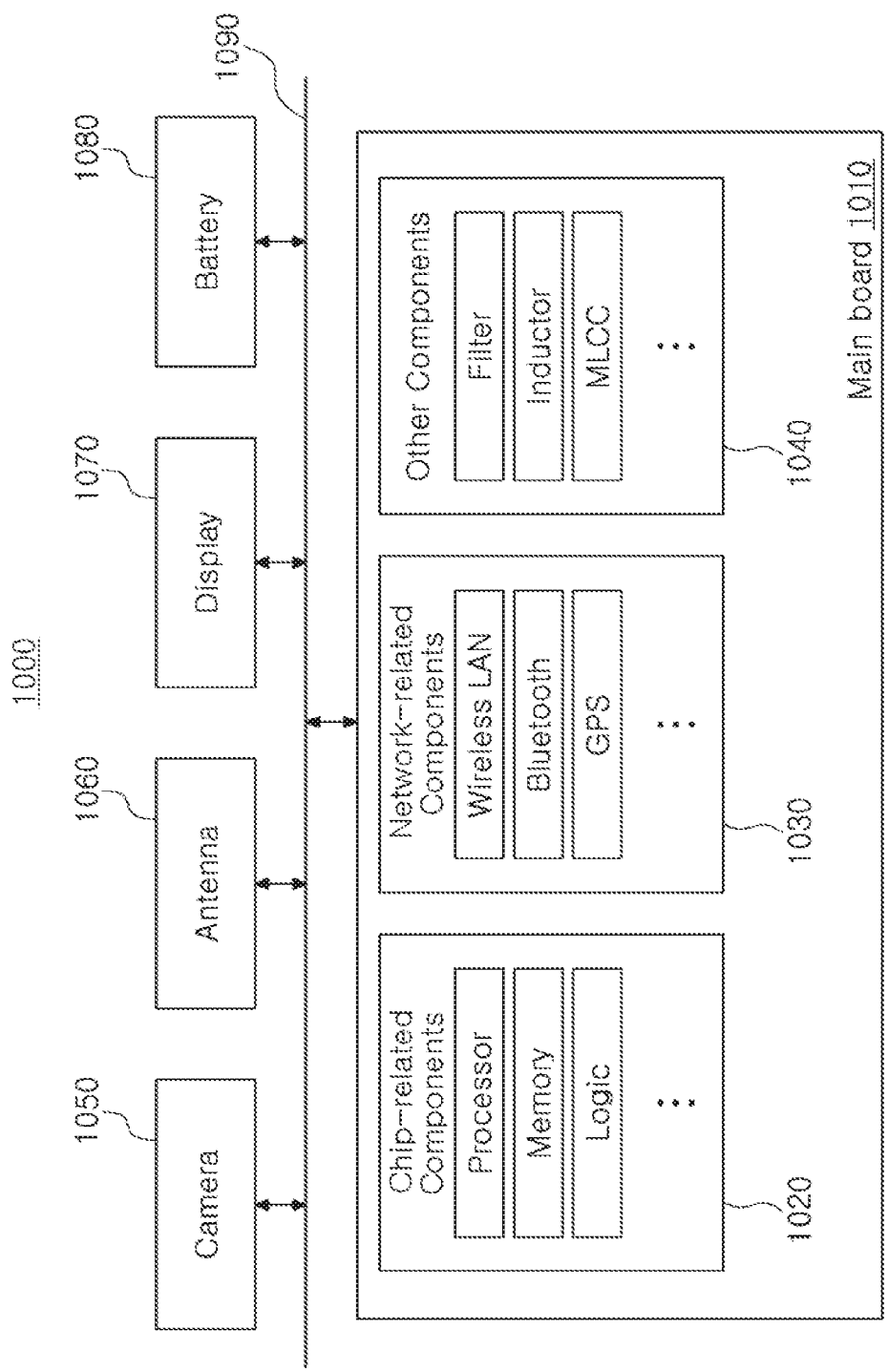
FIG. 1 is a schematic block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

Electronic Device

FIG. 1 is a schematic block diagram illustrating an example of an electronic device system.

Referring to FIG. 1, an electronic device 1000 may accommodate a mainboard 1010 therein. The mainboard

1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
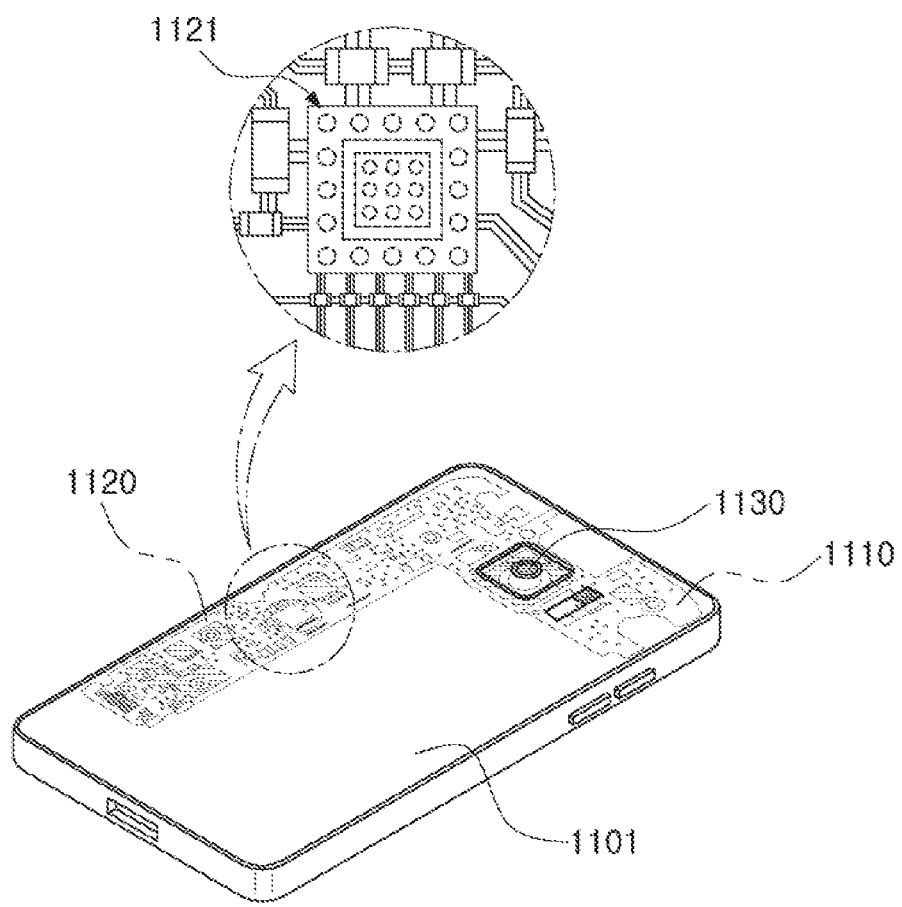
FIG. 2 is a schematic perspective diagram illustrating an example of an electronic device.

FIG. 2 is a schematic perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described in greater detail with reference to the drawings.

Fan-In Semiconductor Package

Figure 3A:
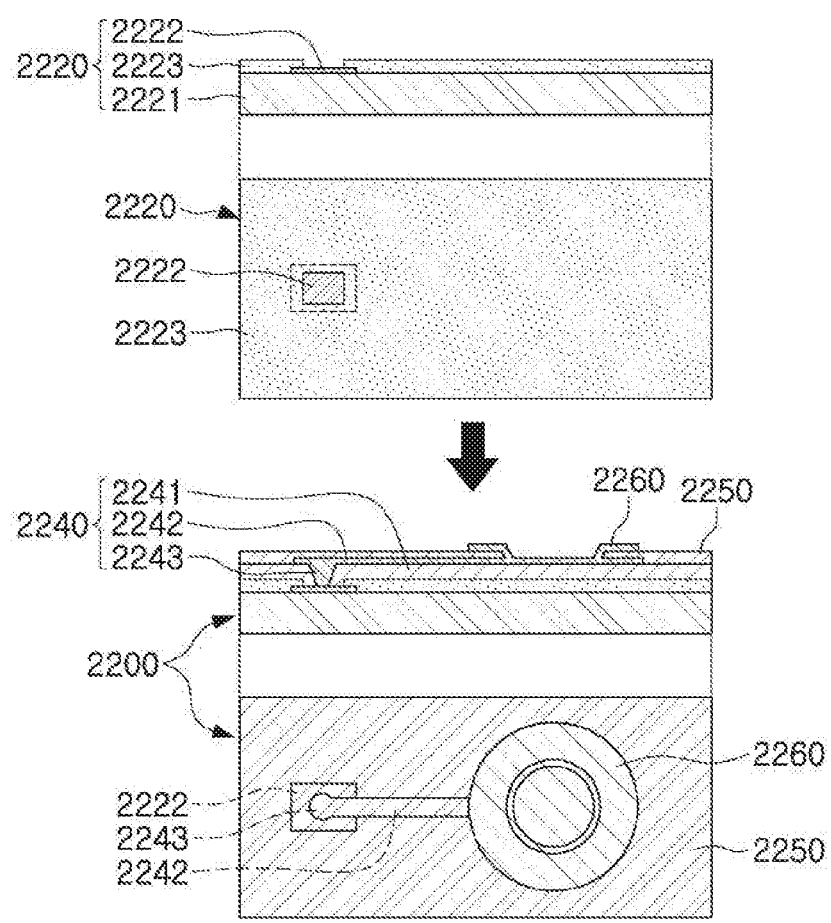
FIGS. 3A and 3B are schematic cross-sectional diagrams illustrating states of a fan-in semiconductor package before and after a packaging process.
Figure 3B:
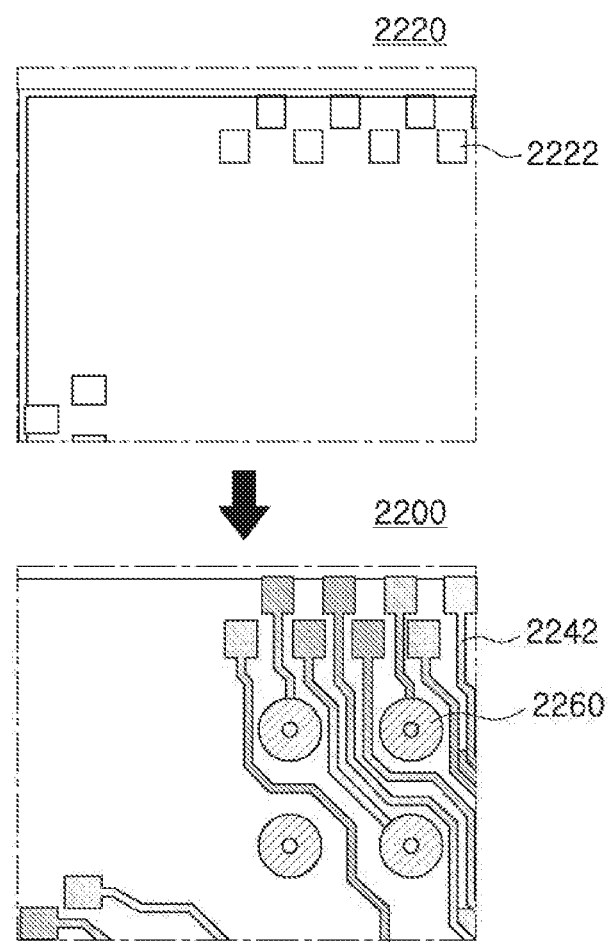

FIGS. 3A and 3B are schematic cross-sectional diagrams illustrating states of a fan-in semiconductor package before and after a packaging process.

Figure 4:
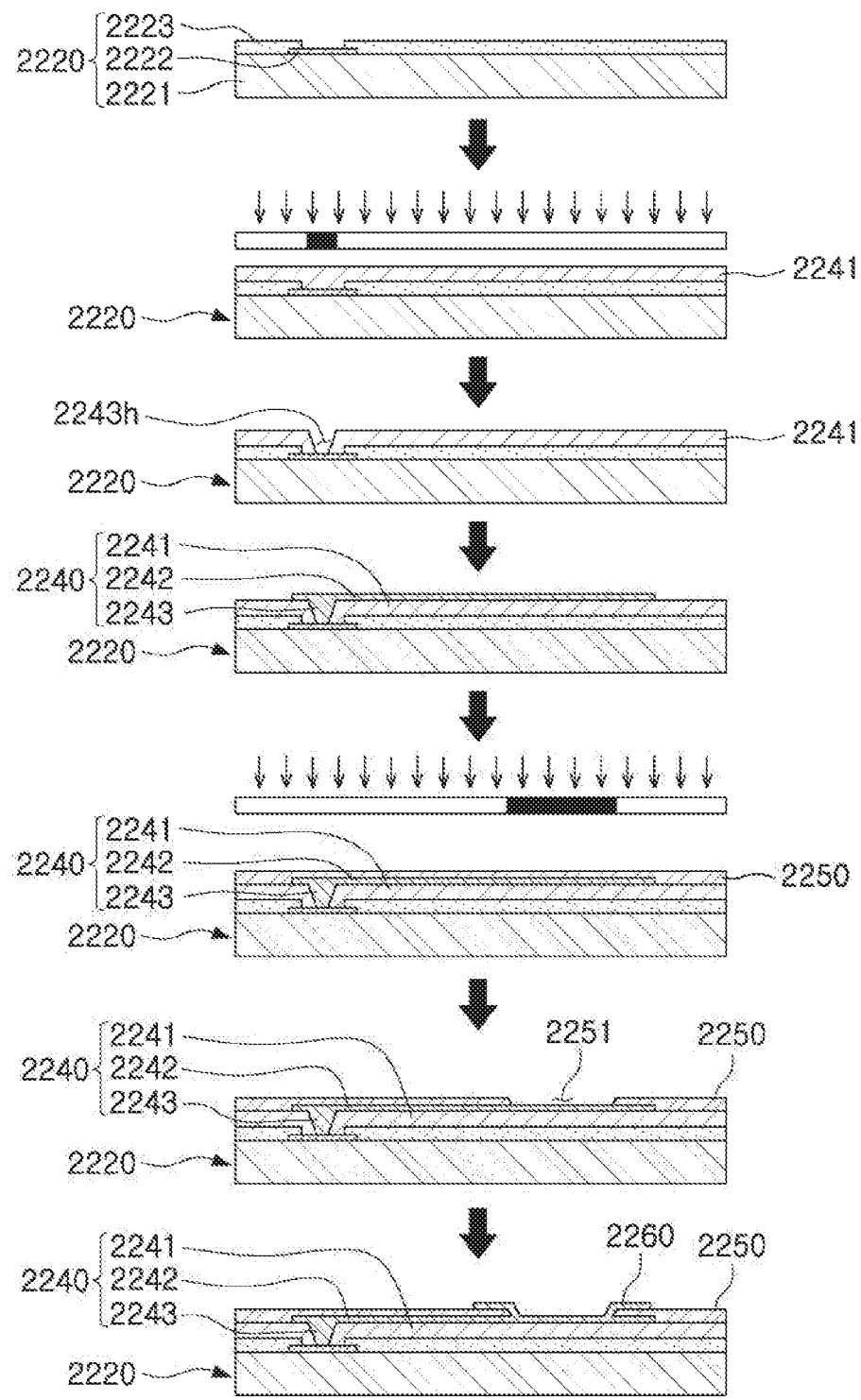
FIG. 4 is a schematic cross-sectional diagram illustrating a process of packaging a fan-in semiconductor package.

FIG. 4 is a schematic cross-sectional diagram illustrating a process of packaging a fan-in semiconductor package.

Referring to the diagrams, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
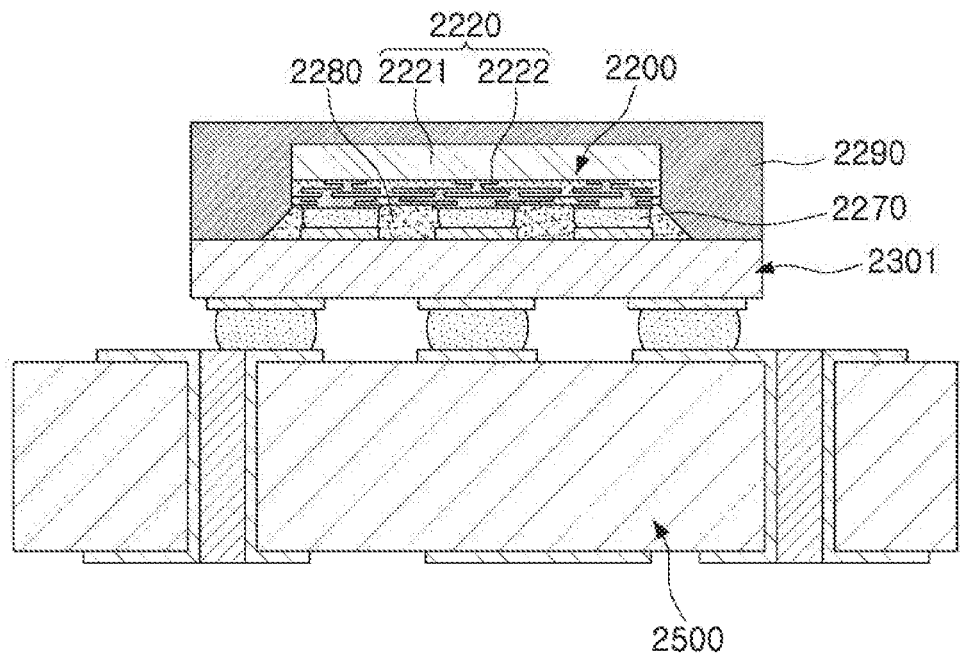
FIG. 5 is a schematic cross-sectional diagram illustrating an example in which a fan-in semiconductor package is mounted on a printed circuit board and mounted on a mainboard of an electronic device.

FIG. 5 is a schematic cross-sectional diagram illustrating an example in which a fan-in semiconductor package is mounted on a printed circuit board and mounted on a mainboard of an electronic device.

Figure 6:
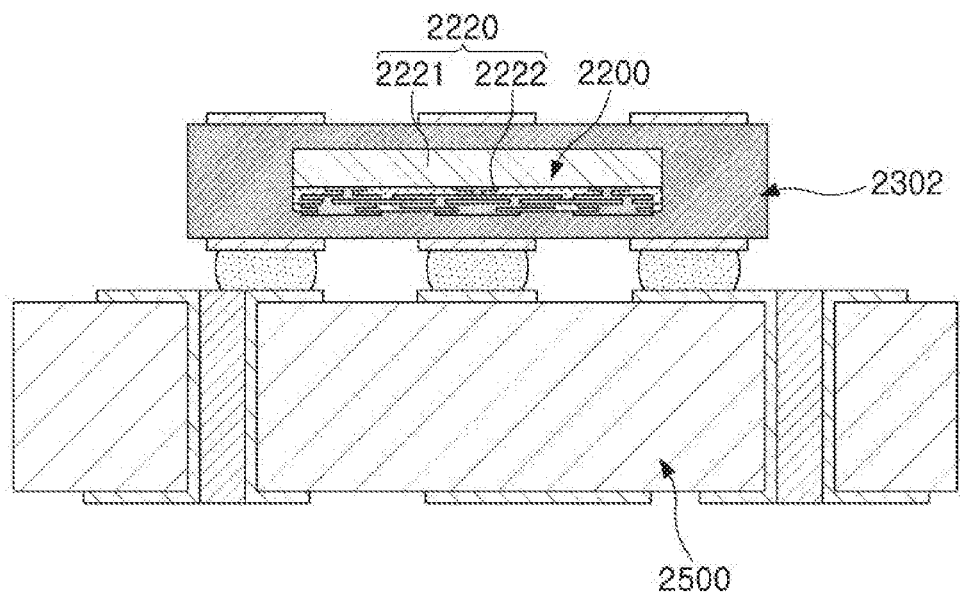
FIG. 6 is a schematic cross-sectional diagram illustrating an example in which a fan-in semiconductor package is mounted in a printed circuit board and mounted on a mainboard of an electronic device.

FIG. 6 is a schematic cross-sectional diagram illustrating an example in which a fan-in semiconductor package is mounted in a printed circuit board and mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
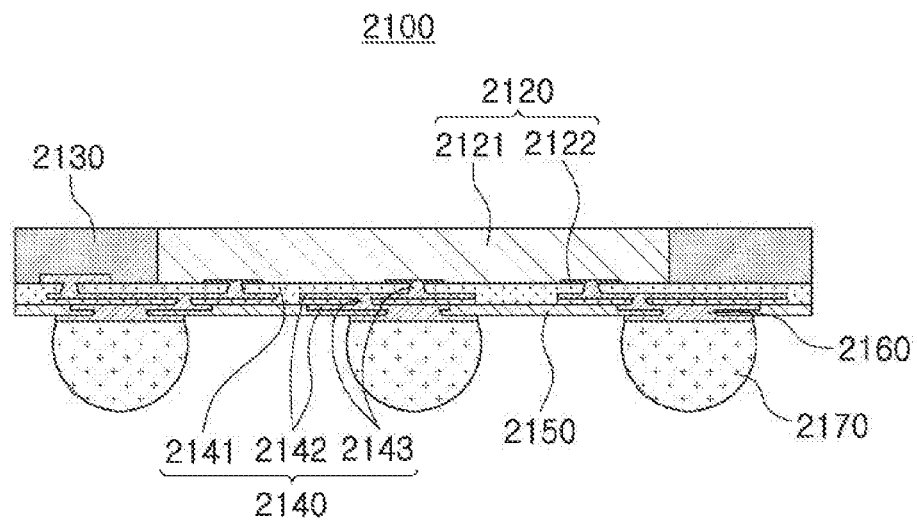
FIG. 7 is a schematic cross-sectional diagram illustrating a fan-out semiconductor package.

FIG. 7 is a schematic cross-sectional diagram illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
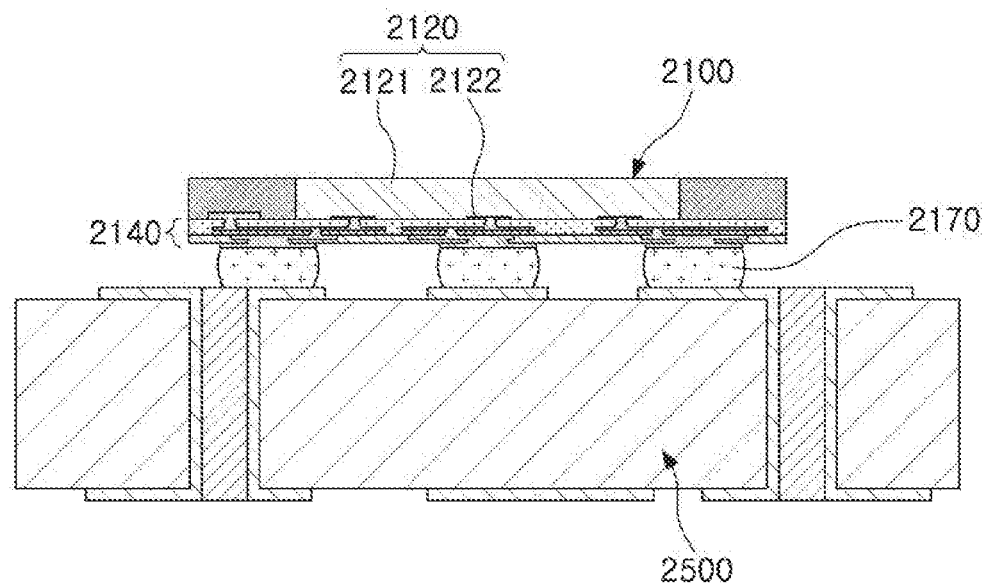
FIG. 8 is a schematic cross-sectional diagram illustrating an example in which a fan-out semiconductor package is mounted on a mainboard of an electronic device.

FIG. 8 is a schematic cross-sectional diagram illustrating an example in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

In the description below, a semiconductor package including a metal layer for shielding electromagnetic waves which may have improved adhesive strength will be described with reference to the drawings.

Figure 9:
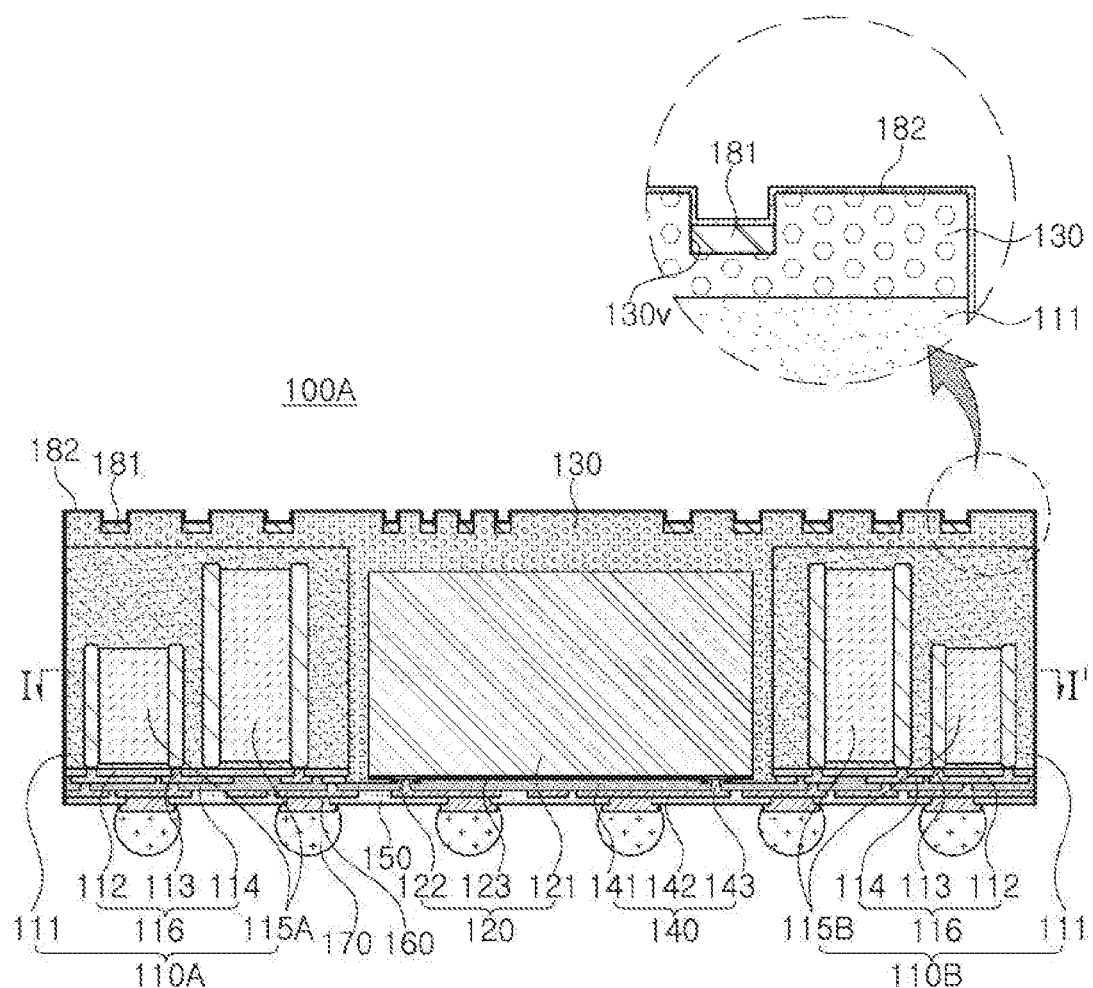
FIG. 9 is a schematic cross-sectional diagram illustrating an example of a semiconductor package.

FIG. 9 is a schematic cross-sectional diagram illustrating an example of a semiconductor package.

Figure 10:
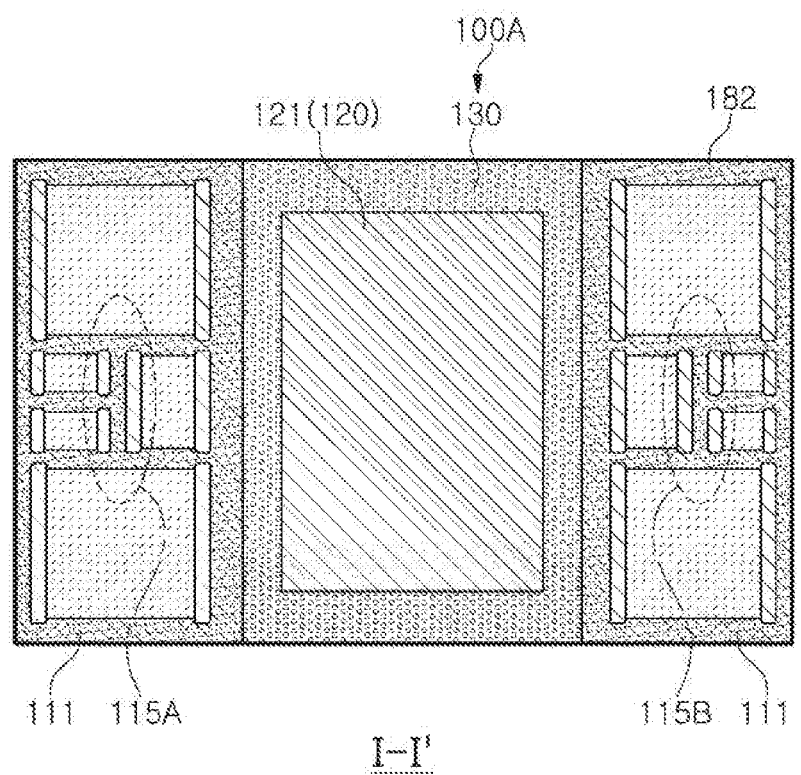
FIG. 10 is a schematic plan diagram illustrating a semiconductor package illustrated in FIG. 9 taken along lines I-I'.

FIG. 10 is a schematic plan diagram illustrating a semiconductor package illustrated in FIG. 9 taken along lines I-I'.

Referring to the drawings, a semiconductor package 100A in the example embodiment may include a semiconductor chip 120 having an active surface on which a connection pad 122 is disposed and an inactive surface opposing the active surface, a first encapsulant 130 covering at least a portion of each of the inactive surface and side surfaces of the semiconductor chip 120 and having one or more recessed portions 130v recessed towards the inactive surface of the semiconductor chip 120, metal layers 181 and 182 disposed on the first encapsulant 130 and filling at least a portion of each of the recessed portions 130v, and an interconnect structure 140 disposed on an active surface of the semiconductor chip 120 and including a redistribution layer 142 electrically connected to the connection pad 122.

In the recessed portion 130v, surfaces of the metal layers 181 and 182 in contact with the first encapsulant 130 may have a surface roughness greater than a surface roughness of surfaces of the metal layers 181 and 182 opposing the surfaces in contact with the first encapsulant 130. For example, the surfaces of the metal layers 181 and 182 in contact with the first encapsulant 130 may have a surface roughness greater than a surface roughness of other surfaces of the metal layers 181 and 182 not in contact with the first encapsulant 130, or the surfaces of the metal layers 181 and 182 in contact with the first encapsulant 130 may have a surface roughness greater than a surface roughness of other surfaces of the metal layers 181 and 182 spaced apart from the first encapsulant 130. More preferably, the metal layers 181 and 182 may cover an upper surface of the first encapsulant 130, and surfaces of the metal layers 181 and 182 in contact with an upper surface of the first encapsulant 130 may have a surface roughness greater than a surface roughness of surfaces of the metal layers 181 and 182 opposing the surfaces in contact with an upper surface of the first encapsulant 130. Also, the metal layers 181 and 182 may cover side surfaces of the first encapsulant 130, and surfaces of the metal layers 181 and 182 in contact with an upper surface of the first encapsulant 130 may have a surface roughness greater than a surface roughness of surfaces of the metal layers 181 and 182 in contact with side surfaces of the first encapsulant 130.

As described above, a deposition method such as a sputtering process may be used as an electromagnetic waves shielding technique. Materials having improved properties used as an encapsulant, and the like, may include a large amount of internal ceramic filler, and etchability of the materials is poor. Thus, when a metal layer for EMI shielding is formed through a sputtering process, or the like, adhesive strength may decrease, and when adhesive strength decreases, an EMI shielding layer may be lifted due to volumetric expansion of steam or moisture included in a package during a heat treatment process such as a reflow process.

In the semiconductor package 100A in the example embodiment, one or more recessed portions 130v may be provided on an upper surface of the first encapsulant 130 on which the metal layers 181 and 182 are formed, and the metal layers 181 and 182 may fill at least portions of the recessed portions 130v. Accordingly, a contact area between the first encapsulant 130 and the metal layers 181 and 182 may increase, and an anchoring effect may be generated, thereby improving adhesive strength between the first encapsulant 130 and the metal layers 181 and 182. Also, an interfacial surface between the first encapsulant 130 and the metal layers 181 and 182 may be configured to have an increased surface roughness, and as the area of the interfacial surface between the first encapsulant 130 and the metal layers 181 and 182 increases, adhesive strength may further improve.

In the example embodiment, the metal layers 181 and 182 may include the first metal layer 181 filling at least a portion of each of the recessed portions 130v, and the second metal layer 182 disposed on the first metal layer, filling at least the other portion of each of the recessed portions 130v, and covering an upper surface and side surfaces of the first encapsulant 130. The first and second metal layers 181 and 182 may be separated layers, and a boundary between the first and second metal layers 181 and 182 may be distinct. A surface of the first metal layer 181 being in contact with the first encapsulant 130 may have a surface roughness greater than a surface of the first metal layer 181 being in contact with the second metal layer 182, and a surface of the second metal layer 182 being in contact with the first encapsulant 130 may have a surface roughness greater than a surface roughness of a surface of the second metal layer 182 being in contact with the first metal layer 181. Thus, while the first metal layer 181 fills at least portions of the recessed portions 130v, when the second metal layer 182 is formed on the first metal layer 181 and the first encapsulant 130, adhesive strength may improve due to the above-described surface roughness and the recessed portions 130v, and due to improved joint strength between the metals, adhesive strength may further improve. The second metal layer 182 may extend from the upper surface of the first encapsulant 130 to cover side surfaces of the first encapsulant 130 and side surfaces of the one or more component embedded structures 110A and 110B. In one example, the second metal layer 182 may further extend to cover side surfaces of the wiring structures 116 and the interconnect structure 140. In this case, the second metal layer 182 may cover five surfaces of the semiconductor package 100A and may not cover only a lower surface, i.e., the surface having the connection electrical connector metal 170, of the semiconductor package 100A.

At least one of the recessed portions 130v formed on the first encapsulant 130 may be used as a marking pattern for identification. The marking pattern may refer to a pattern represented as texts, numbers, or images for identifying a package, which is an information indicator or a trademark indicator such as an execution number, a manufacturer, and a manufacturing date, or combinations thereof. Thus, the recessed portions 130v may be included to improve adhesive strength of the metal layers 181 and 182, and may be included to introduce the marking pattern of a package. Due to the recessed portions 130v, a process for creating a marking pattern may not be necessary.

In the example embodiment, one or more component embedded structures 110A and 110B including one or more passive components 115A and 115B disposed therein, respectively, and disposed in parallel to the semiconductor chip 120 may further be disposed on the interconnect structure 140. The first encapsulant 130 may cover at least a portion of each of the component embedded structures 110A and 110B along with the semiconductor chip 120. By including the component embedded structures 110A and 110B, the passive components 115A and 115B may be embedded in the package along with the semiconductor chip 120, and may be modularized. Due to the above-described structure, sizes of components applied in an electronic device may be significantly reduced, and a mounting area in a printed circuit board such as a mainboard may also be significantly reduced, which may resolve the issue of an increased battery area caused by an increase of battery capacity. Also, as the component embedded structures 110A and 110B are manufactured and embedded as individual components in addition to the semiconductor chip 120, even when defects occur during the process of manufacturing the component embedded structures 110A and 110B, a yield of the semiconductor chip 120 may not be greatly affected.

The component embedded structures 110A and 110B each may include one or more passive components 115A and 115B, a second encapsulant 111 in which the passive components 115A and 115B are embedded, and a wiring structure 116 disposed on each of a lower portion of the passive components 115A and 115B and including a wiring layer 114 electrically connected to the passive components 115A and 115B, and the wiring layer 114 may be electrically connected to the connection pad 122 through a redistribution layer 142. Due to the wiring structure 116, a stepped portion may be formed between a lower surface of each of the passive components 115A and 115B and an active surface of the semiconductor chip 120. A lower surface of the wiring layer 114 may be coplanar with the active surface of the semiconductor chip 120. As the wiring structure 116 is included in the component embedded structures 110A and 110B before other elements, a material of an insulating layer 112 of the wiring structure 116 may be selected regardless of the semiconductor chip 120. A material of the insulating layer 112 may be a non-photosensitive insulating material including an inorganic filler, instead of a photosensitive insulating material (e.g., a PID), such as an ABF, and the like. A film-type non-sensitive insulating material may easily be planarized, and may thus effectively resolve the issues of undulation and cracks. Also, when a non-sensitive insulating material is used, an opening may be formed using a laser via, and thus, even when a material of the second encapsulant 111 is bled to electrodes of the passive components 115A and 115B, the electrodes may be effectively opened using a laser via. Accordingly, the defect of opened electrode may also be resolved.

The semiconductor package 100A in the example embodiment may further include a passivation layer 150 disposed on a lower portion of the interconnect structure 140, and having an opening for opening at least a portion of the redistribution layer 142, an under bump metal 160 disposed on the opening of the passivation layer 150 and connected to an exposed redistribution layer, and an electrical connector metal 170 disposed in a lower portion of the passivation layer 150 and electrically connected to the exposed redistribution layer 142 through the under bump metal 160, and the semiconductor package 100A may accordingly be mounted on a mainboard and connected through the above-described elements.

In the description below, elements of the semiconductor package 100A will be described in greater detail.

The semiconductor chip 120 may be an integrated circuit (IC) in which several hundreds to several millions or more of devices are integrated in a single chip. The integrated circuit may be a power management integrated circuit (PMIC), but an example embodiment thereof is not limited thereto. The integrated circuit may be a memory chip such as a volatile memory (for example, a dynamic random access memory (DRAM)), a non-volatile memory (for example, a read only memory (ROM)), a flash memory, or the like, an application processor chip such as a central processor (for example, a central processing unit (CPU)), a graphics processor (for example, a graphics processing unit (GPU)), a digital signal processor, a cryptographic processor, a microprocessor, a microcontroller, or the like, or a logic chip such as an analog-to-digital (ADC) converter, an application-specific integrated circuit (ASIC), or the like.

The semiconductor chip 120 may be an integrated circuit in a bare state in which a bump or a wiring layer is not formed. An integrated circuit may be formed based on an active wafer. In this case, a silicon (Si), germanium (Ge), gallium arsenide (GaAs), and the like, may be used as a base material of the body 121 of the semiconductor chip 120. The body 121 may include various circuits. The connection pad 122 may electrically connect the semiconductor chip 120 to other elements, and a metal material such as aluminum (Al), and the like, may be used as a material of the connection pad 122 without any particular limitation. A passivation film 123 exposing the connection pad 122 may be formed on the body 121, and the passivation film 123 may be an oxide film or a nitride film, or may be a dual layer including an oxide layer and a nitride layer. An insulating film (not illustrated) may further be disposed in other desired positions. In the semiconductor chip 120, a surface on which the connection pad 122 is disposed may be an active surface, and an opposite surface may be an inactive surface. When the passivation film 123 is formed on the active surface of the semiconductor chip 120, the active surface of the semiconductor chip 120 may determine a positional relationship with reference to a lowermost surface of the passivation layer 123.

The first encapsulant 130 may capsulate the semiconductor chip 120. The first encapsulant 130 may include an insulating material, and the insulating material may be a material including an inorganic filler and an insulating resin, such as a thermosetting resin such as an epoxy resin, a thermoplastic resin such as a polyimide resin, or a resin in which a reinforcement such as an inorganic filler is included in the above-described resins, such as an ABF, FR-4, BT, a resin, and the like, for example. Also, a well-known molding material such as an EMC may be used, and a photosensitive material such as a photoimageable encapsulant (PIE) resin may be used if desired. Also, a resin in which an insulating resin such as a thermosetting resin or a thermoplastic resin is impregnated in a core material such as an inorganic filler and/or a glass fiber (or a glass cloth or a glass fabric), and the like, may be used.

One or more recessed portions 130v recessed towards the inactive surface of the semiconductor chip 120 may be provided on an upper surface of the first encapsulant 130. The recessed portions 130v may improve adhesive strength of the metal layers 181 and 182 attached to the first encapsulant 130 as the metal layers 181 and 182 are filled. Also, as described above, at least one of the recessed portions 130v may be used as a marking pattern for identification.

The metal layers 181 and 182 may cover an upper surface of the first encapsulant 130, and may fill at least a portion of each of the recessed portions 130v. The metal layers 181 and 182 may also cover side surfaces of the first encapsulant 130. Due to the metal layers 181 and 182, electromagnetic waves may be shielded in the semiconductor package 100A. In the example embodiment, the metal layers 181 and 182 may include the first metal layer 181 filling at least a portion of each of the recessed portions 130v, and the second metal layer 182 disposed on the first metal layer, filling at least the other portion of each of the recessed portions 130v, and covering an upper surface and side surfaces of the first encapsulant 130. The first and second metal layers 181 and 182 may be separated layers, and a boundary between the first and second metal layers 181 and 182 may be distinct. A surface of the first metal layer 181 in contact with the first encapsulant 130 may have a surface roughness greater than a surface of the first metal layer 181 in contact with the second metal layer 182, and a surface of the second metal layer 182 in contact with the first encapsulant 130 may have a surface roughness greater than a surface roughness of a surface of the second metal layer 182 in contact with the first metal layer 181. Due to the above-described structure, adhesive strength may improve. The metal layers 181 and 182 each may include a metal material. The metal material may be copper (Cu), aluminum (Al), silver (Ag), tin (Sn), gold (Au), nickel (Ni), lead (Pb), titanium (Ti), or alloys thereof.

The interconnect structure 140 may redistribute the connection pads 122 of the semiconductor chip 120, and may electrically connect the semiconductor chip 120 to the passive components 115A and 115B. The several tens or several hundreds of connection pads 122 of the semiconductor chip 120 having various functions may be redistributed through the interconnect structure 140, and may be physically and/or electrically connected to an external entity through an electrical connector metal 170 in accordance with respective functions. The interconnect structure 140 may include an insulating layer 141 disposed on the component embedded structures 110A and 110B and the active surface of the semiconductor chip 120, the redistribution layer 142 disposed in a lower portion of the insulating layer 141, and a connection via 143 penetrating the insulating layer 141 and electrically connecting the redistribution layer 142 to the wiring layer 114 and the connection pad 122. The interconnect structure 140 may include a plurality of the insulating layers 141, and may include a plurality of the redistribution layers 142. In this case, the connection via 143 may also include a plurality of layers, and may electrically connect the redistribution layers 142 disposed on different layers.

As a material of the insulating layer 141, a photosensitive insulating material (PID) may be used, and in this case, a fine pitch may be included through a photo via, and thus, several tens to several millions of connection pads 122 of the semiconductor chip 120 may be effectively redistributed. The photosensitive insulating material (PID) may include a small amount of an inorganic filler or may not include an inorganic filler. Thus, according to the example embodiment, a material of the insulating layer 112 on which the wiring layer 114 for redistributing the passive components 115A and 115B and the wiring via 113 are formed, and a material of the insulating layer 141 on which the redistribution layer 142 for redistributing the connection pads 122 of the semiconductor chip 120 and the connection via 143 are formed may be selectively controlled.

The redistribution layer 142 may redistribute the connection pads 122 of the semiconductor chip 120 and may electrically connect the connection pads 122 of the semiconductor chip 120 to the electrical connector metal 170. A material of the redistribution layer 142 may be a metal material such as copper (Cu), aluminum (Al), silver (Ag), tin (Sn), gold (Au), nickel (Ni), lead (Pb), titanium (Ti), or alloys thereof. The redistribution layer 142 may perform various functions depending on a design. For example, the redistribution layer 182 may include a ground (GrouND: GND) pattern, a power (PoWeR: PWR) pattern, a signal (Signal: S) pattern, and the like. The signal (S) pattern may include various signals other than a ground (GND) pattern, a power (PWR) pattern, and the like, such as a data signal. The redistribution layer 142 may also include a via pad, an electrical connector metal pad, and the like. The second metal layer 182 may be in contact with a ground (GND) pattern of the redistribution layer 142 exposed from the side surface of the interconnect structure 140.

The connection via 143 may electrically connect the wiring layer 114, the connection pad 122, and the redistribution layer 142 formed on different layers. The connection via 143 may be physically in contact with the connection pads 122 of the semiconductor chip 120. The semiconductor chip 120 may be directly connected to the connection via 143 of the interconnect structure 140 in bear die form without a bump, or the like. As a material of the connection via 143, a metal material such as copper (Cu), aluminum (Al), silver (Ag), tin (Sn), gold (Au), nickel (Ni), lead (Pb), titanium (Ti), or alloys thereof may be used. The connection via 143 may be a filled type completely filled with a metal material, or may be conformal type in which a metal material is formed along a side wall of a via hole. The connection via 143 may have a tapered shape.

The component embedded structures 110A and 110B may include the passive components 115A and 115B in the semiconductor package 100A such that the semiconductor package 100A may be modularized. The component embedded structures 110A and 110B each may include one or more passive components 115A and 115B, the second encapsulant 111 in which the passive components 115A and 115B are embedded, and the wiring structure 116 disposed in a lower portion of each of the passive components 115A and 115B and including the wiring layer 114 electrically connected to the passive components 115A and 115B.

The passive components 115A and 115B each may be a capacitor such as a multilayer ceramic capacitor (MLCC), a low inductance chip capacitor (LICC), an inductor such as a power inductor, a bead, and the like. The passive components 115A and 115B each may be a capacitor preferably, but an example embodiment thereof is not limited thereto. The passive components 115A and 115B may have different thicknesses. Thicknesses of the passive components 115A and 115B may also be different from a thickness of the semiconductor chip 120. The number of the component embedded structures 110A and 110B may not be limited to any particular number, and may be greater or less than the example illustrated in the diagram.

The second encapsulant 111 may encapsulate the passive components 115A and 115B. The second encapsulant 111 may include an insulating material, and the insulating material may be a material including an inorganic filler and an insulating resin, such as a thermosetting resin such as an epoxy resin, a thermoplastic resin such as a polyimide resin, or a resin in which a reinforcement such as an inorganic filler is included in the above-described resins, such as an ABF, FR-4, BT, a resin, and the like, for example. Also, an EMC, a PIE, and the like, may be used. Also, a resin in which an insulating resin such as a thermosetting resin or a thermoplastic resin is impregnated in a core material such as an inorganic filler and/or a glass fiber (or a glass cloth or a glass fabric), and the like, may be used if desired.

The second encapsulant 111 may include the same material as a material of the first encapsulant 130, and may also include a different material. Even when the second encapsulant 111 and the first encapsulant 130 include the same material, a boundary therebetween may be distinct. The second encapsulant 111 and the first encapsulant 130 may include similar materials, but colors thereof may be different. For example, the first encapsulant 130 may be more transparent than the second encapsulant 111, and a boundary therebetween may be distinct. If desired, the second encapsulant 111 may implemented as an insulating material, and the first encapsulant 130 may be implemented as a magnetic material. In this case, the first encapsulant 130 may have an EMI absorbing effect. As electrodes are not exposed through a body 121 in the semiconductor chip 120, the first encapsulant 130 may be implemented as a magnetic material without any significant problem.

The wiring structure 116 may include an insulating layer 112, the wiring layer 114 disposed on a lower surface of the an insulating layer 112, and a wiring via 113 penetrating the insulating layer 112 and electrically connecting electrodes of the passive components 115A and 115B to the wiring layer 114. The wiring structure 116 may include a greater number of insulating layers, wiring layers, and wiring vias than in the example illustrated in the diagram.

As a material of the insulating layer 112, an insulating material may be used. The insulating material may be a non-photosensitive insulating material including an inorganic filler such as silica or alumina, as an ABF, for example. In this case, the defects of undulation and cracks may be effectively resolved, and also the defect of opened electrode of the passive components 115A and 115B caused by bleeding of a material of the second encapsulant 111 may also be resolved.

The insulating layer 112 may have a coefficient of thermal expansion lower than that of the insulating layer 141. That is because the insulating layer 112 includes an inorganic filler. The insulating layer 141 may also include a small amount of inorganic filler if desired, but in this case, a weight percentage of the inorganic filler included in the insulating layer 112 may be higher than a weight percentage of the inorganic filler included in the insulating layer 141. Thus, a coefficient of thermal expansion of the insulating layer 112 may be lower than a coefficient of thermal expansion of the wiring layer 114. As the insulating layer 112 includes a larger amount of an inorganic filler and has a lower coefficient of thermal expansion accordingly, the insulating layer 112 may have less thermosetting retraction such that warpage may be prevented. Thus, the issues of undulation and cracks may be effectively resolved, and the defect of opened electrodes of the passive components 115A and 115B may also be resolved.

The wiring layer 114 may redistribute electrodes of the passive components 115A and 115B and may electrically connect the electrodes to the connection pads 122 of the semiconductor chip 120. The wiring layer 114 may work as a redistribution layer RDL. As a material of the wiring layer 114, a metal material such as copper (Cu), aluminum (Al), silver (Ag), tin (Sn), gold (Au), nickel (Ni), lead (Pb), titanium (Ti), or alloys thereof may be used. The wiring layer 114 may perform various functions depending on a design. The wiring layer 114 may include a ground (GrouND: GND) pattern, a power (PoWeR: PWR) pattern, a signal (Signal: S) pattern, and the like. The signal (S) pattern may include various signals other than a ground (GND) pattern, a power (PWR) pattern, and the like, such as a data signal. The second metal layer 182 may be in contact with ground (GND) patterns of the wiring layer 114 exposed from the side surfaces of the component embedded structures 110A and 110B. The wiring layer 114 may also include a via pad, and the like. A lower surface of the wiring layer 114 may be coplanar with the active surface of the semiconductor chip 120. When a plurality of the wiring layers 114 are provided, a lowermost wiring layer 114 may be coplanar with the active surface of the semiconductor chip 120.

The wiring via 113 may electrically connect the passive components 115A and 115B to the wiring layer 114. The wiring via 113 may be physically in contact with each of the passive components 115A and 115B. The passive components 115A and 115B may be directly in contact with the wiring via 113 by being embedded thereto, rather than by being mounted on a surface using a solder bump, and the like. As a material of the wiring via 113, a metal material such as copper (Cu), aluminum (Al), silver (Ag), tin (Sn), gold (Au), nickel (Ni), lead (Pb), titanium (Ti), or alloys thereof may be used. The wiring via 113 may be a filled type completely filled with a metal material, or may be conformal type in which a metal material is formed along a side wall of a via hole. The wiring via 113 may have a tapered shape.

The passivation layer 150 may protect the interconnect structure 140 from external physical and chemical damages, or the like. The passivation layer 150 may include an opening for exposing at least a portion of the redistribution layer 142 of the interconnect structure 140. Several tens to several thousands of the openings may be formed in the passivation layer 150. The passivation layer 150 may include an insulating resin and an inorganic filler, and may not include a glass fiber. For example, the passivation layer 150 may be an ABF, but a material of the passivation layer 150 is not limited thereto. A surface processing layer formed of nickel (Ni)/gold (Au) may be formed on a surface of the exposed redistribution layer 142.

The under bump metal 160 may improve connection reliability of the electrical connector metal 170, and may thus improve board-level reliability of the semiconductor package 100A. The under bump metal 160 may be connected to the redistribution layer 142 of the interconnect structure 140 exposed through the opening of the passivation layer 150. The under bump metal 160 may be formed in the opening of the passivation layer 150 by a well-known metallization method using a well-known metal material, such as a metal, but the method is not limited thereto.

The electrical connector metal 170 may physically and/or electrically connect the semiconductor package 100A to an external entity. For example, the semiconductor package 100A may be mounted on a mainboard of an electronic device through the electrical connector metal 170. The electrical connector metal 170 may be formed of a metal having a low melting point, such as tin (Sn) or an alloy including tin (Sn), for example. For instance, the electrical connector metal 170 may be formed of a solder, but a material of the electrical connector metal 170 is not limited thereto. The electrical connector metal 170 may be a land, a ball, a pin, or the like. The electrical connector metal 170 may be provided as a plurality of layers or a single layer. When the electrical connector metal 170 are a plurality of layers, the electrical connector metal 170 may include a copper pillar and a solder, and when the electrical connector metal 170 is a single layer, the electrical connector metal 170 may include a tin-silver solder or copper, but an example embodiment thereof is not limited thereto. The number of the electrical connector metals 170, a gap between the electrical connector metals 170, an arrangement form of the electrical connector metals 170 are not limited to any particular example, and may vary depending on a design. For example, the number of the electrical connector metals 170 may be several tens to several thousands depending on the number of the connection pads 122, or may be higher or lower than the above example.

At least one of the electrical connector metals 170 may be disposed in a fan-out region. The fan-out region may refer to a region beyond a region in which the semiconductor chip 120 is disposed. A fan-out package may have improved reliability as compared to a fan-in package, and a plurality of I/O terminals may be implemented, and a 3D connection may easily be implemented in a fan-out package. Also, a fan-out package may have a reduced thickness, and may be cost-competitive as compared to a ball grid array (BGA) package, a land grid array (LGA) package, and other types of packages.

Figure 11:
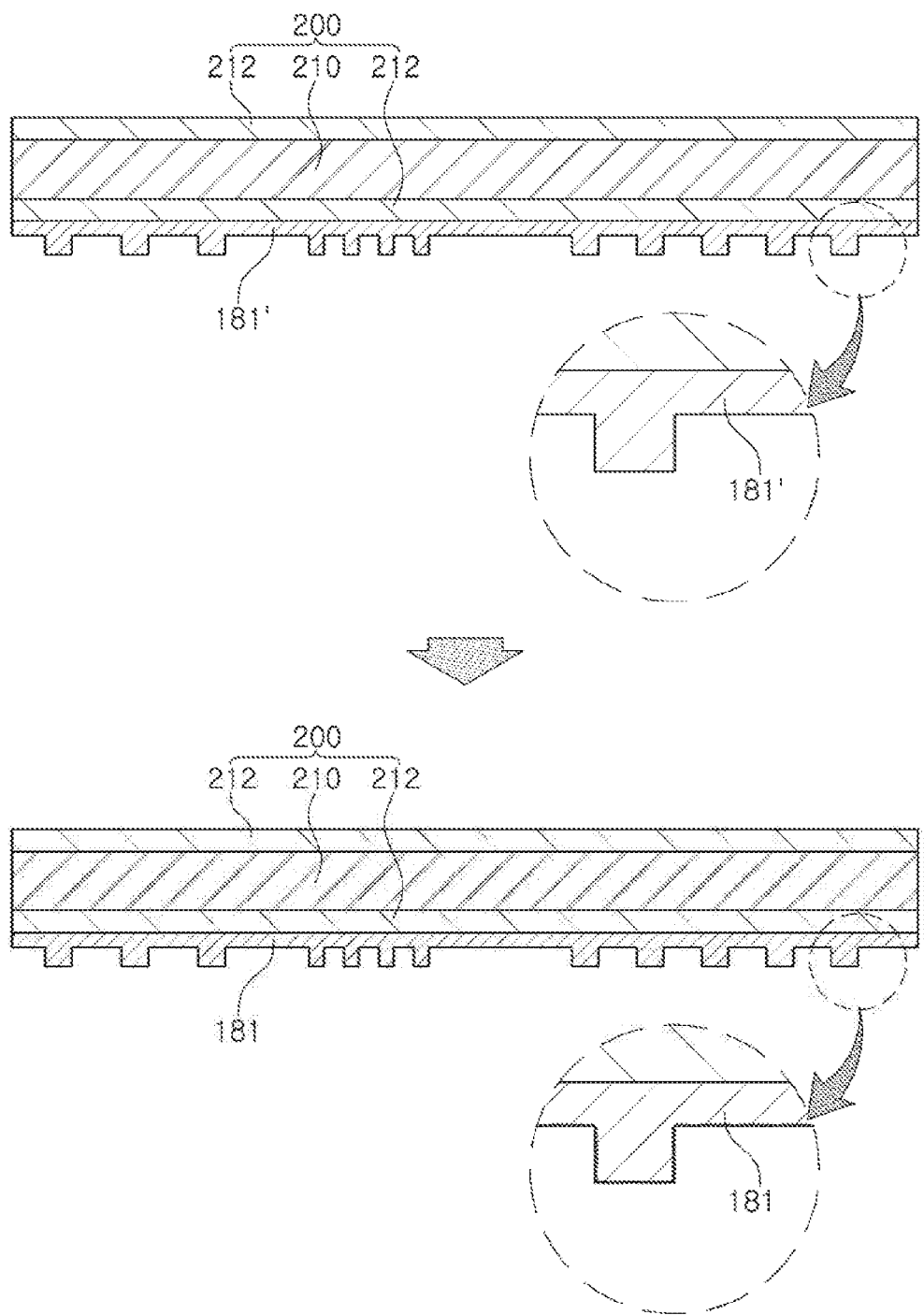
FIGS. 11 to 13 are schematic cross-sectional diagrams illustrating an example of a process of manufacturing a semiconductor package illustrated in FIG. 9.
Figure 12:
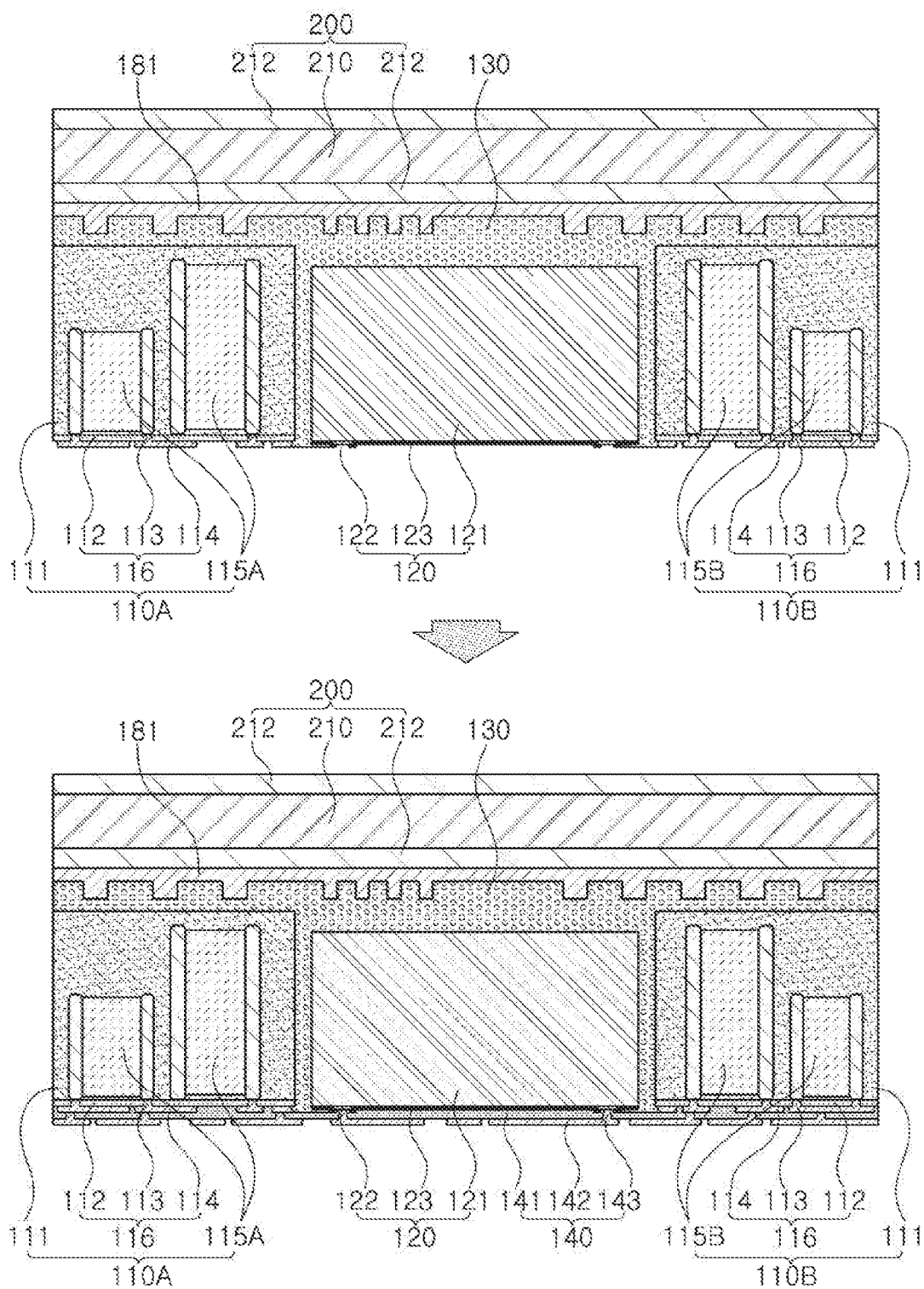
Figure 13:
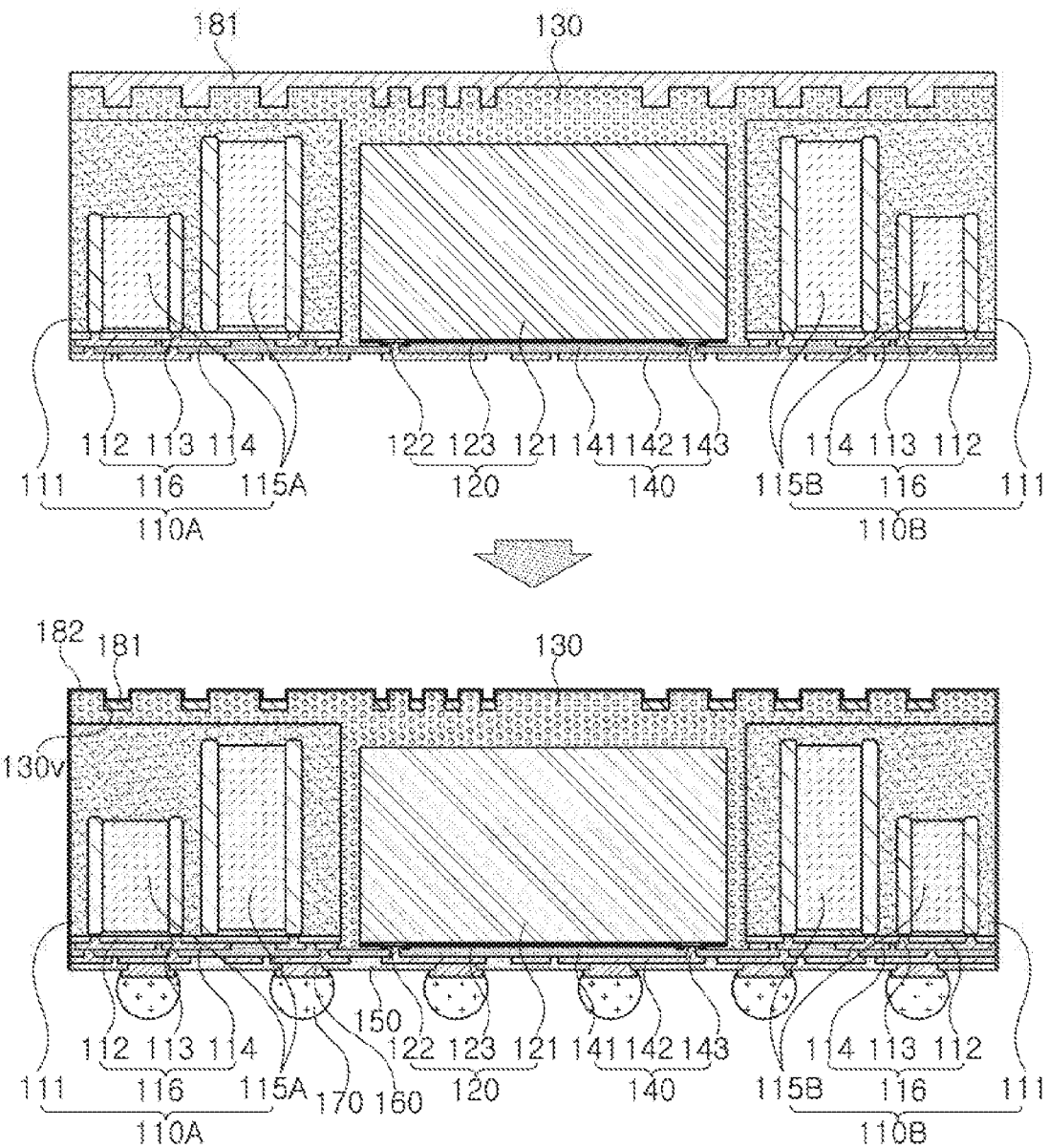

FIGS. 11 to 13 are process diagrams illustrating an example of a process of manufacturing a semiconductor package illustrated in FIG. 9.

Referring to FIG. 11, a carrier 200 including a core layer 210 and metal layers 212 disposed on both sides of the core layer 210 may be prepared, and a plating pattern 181' having one or more serrations may be formed on the metal layer 212 disposed in one portion of the carrier 200 through a plating process such as an additive process (AP), a semi-additive process (SAP), a modified semi-additive process (MSAP), a tenting process, and the like. A roughness may be formed on the surface of the plating pattern 181' having serrations by a method such as an etching process, a Cz process, a black oxide process, a brown oxide process, and the like, and the surface roughness may be configured to be greater than a surface roughness of the opposite surface. By the surface process, a first metal layer 181 may be prepared on the carrier 200.

Referring to FIG. 12, separately manufactured component embedded structures 110A and 110B and a semiconductor chip 120 may be attached to a tape, the component embedded structures 110A and 110B and the semiconductor chip 120 may be encapsulated using a first encapsulant 130, and the carrier 200 may be laminated onto the first encapsulant 130 such that the surface of the first metal layer 181 to which the roughness process is performed may be in contact with the first encapsulant 130. The tape may be detached, and an interconnect structure 140 may be manufactured in a region from which the tape is removed.

Referring to FIG. 13, the carrier 200 may be detached such that the first metal layer 181 may remain in a transcribed state on the first encapsulant 130. The first metal layer 181 may be partially removed by an etching process. For example, the first metal layer 181 may be removed such that an upper surface of the first encapsulant 130 may be exposed, one or more recessed portions 130v may be formed on the first encapsulant 130 by the serrated pattern of the first metal layer 181, and the first metal layer 181 may remain while filling at least portions of the recessed portions 130v. The exposed upper surface of the first encapsulant 130 and the exposed wall of each of the recessed portions 130v may have a significant roughness as the roughness of the first metal layer 181 is transcribed. If desired, a passivation layer 150, an under bump metal 160, and an electrical connector metal 170 may be formed during the manufacturing process. A singulation process may be performed. A second metal layer 182 may be formed on the first encapsulant 130 and the first metal layer 181 through a sputtering process or a well-known plating process, such as an electroplating process or an electroless plating process. An interfacial surface in contact with an upper surface of the first encapsulant 130 and walls of the recessed portions 130v may have improved adhesive strength due to the transcribed roughness, and an interfacial surface between the first metal layer 181 and the second metal layer 182 may also have improved adhesive strength as the same or similar metals are bonded to each other. Through the processes described above, the semiconductor package 100A may be manufactured.

Figure 14:
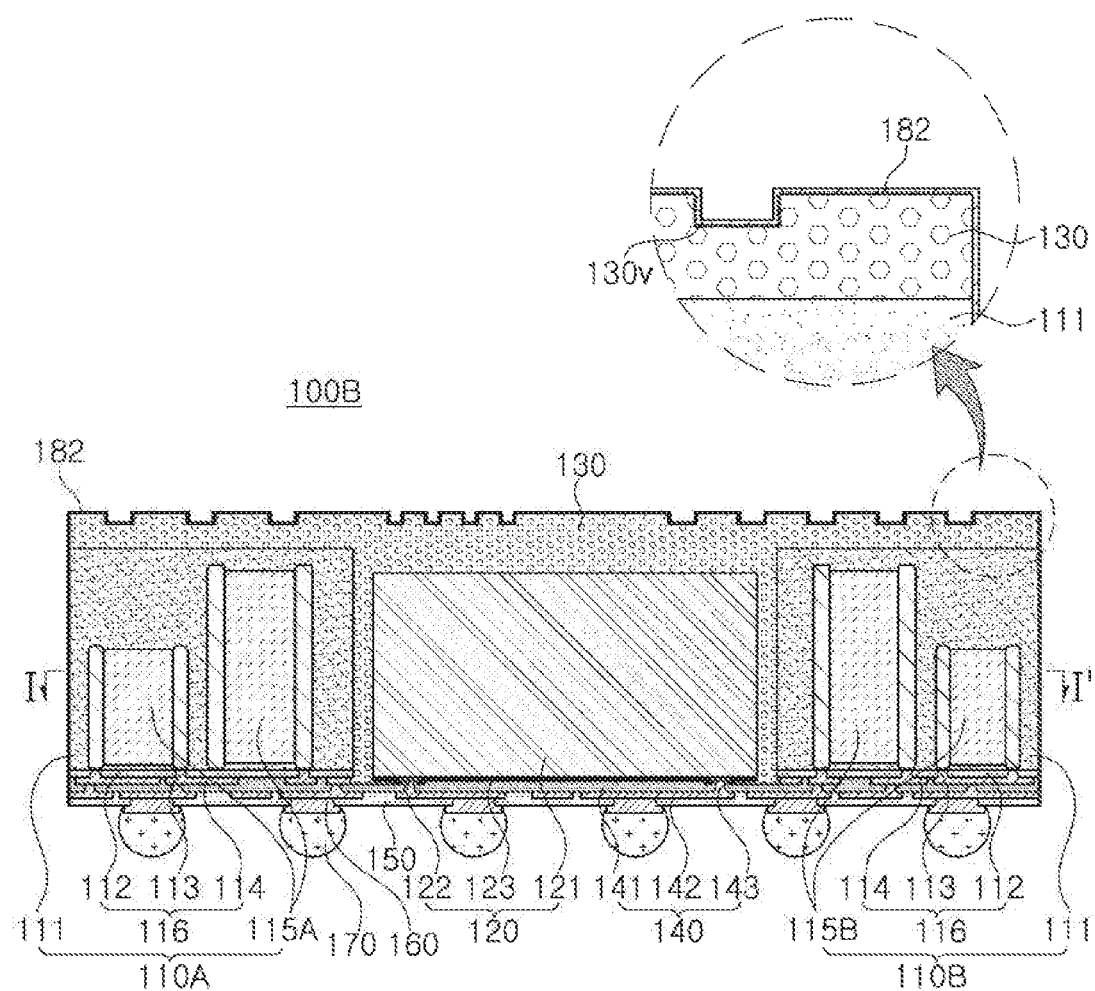
FIG. 14 is a schematic cross-sectional diagram illustrating another example of a semiconductor package.

FIG. 14 is a schematic cross-sectional diagram illustrating another example of a semiconductor package.

Figure 15:
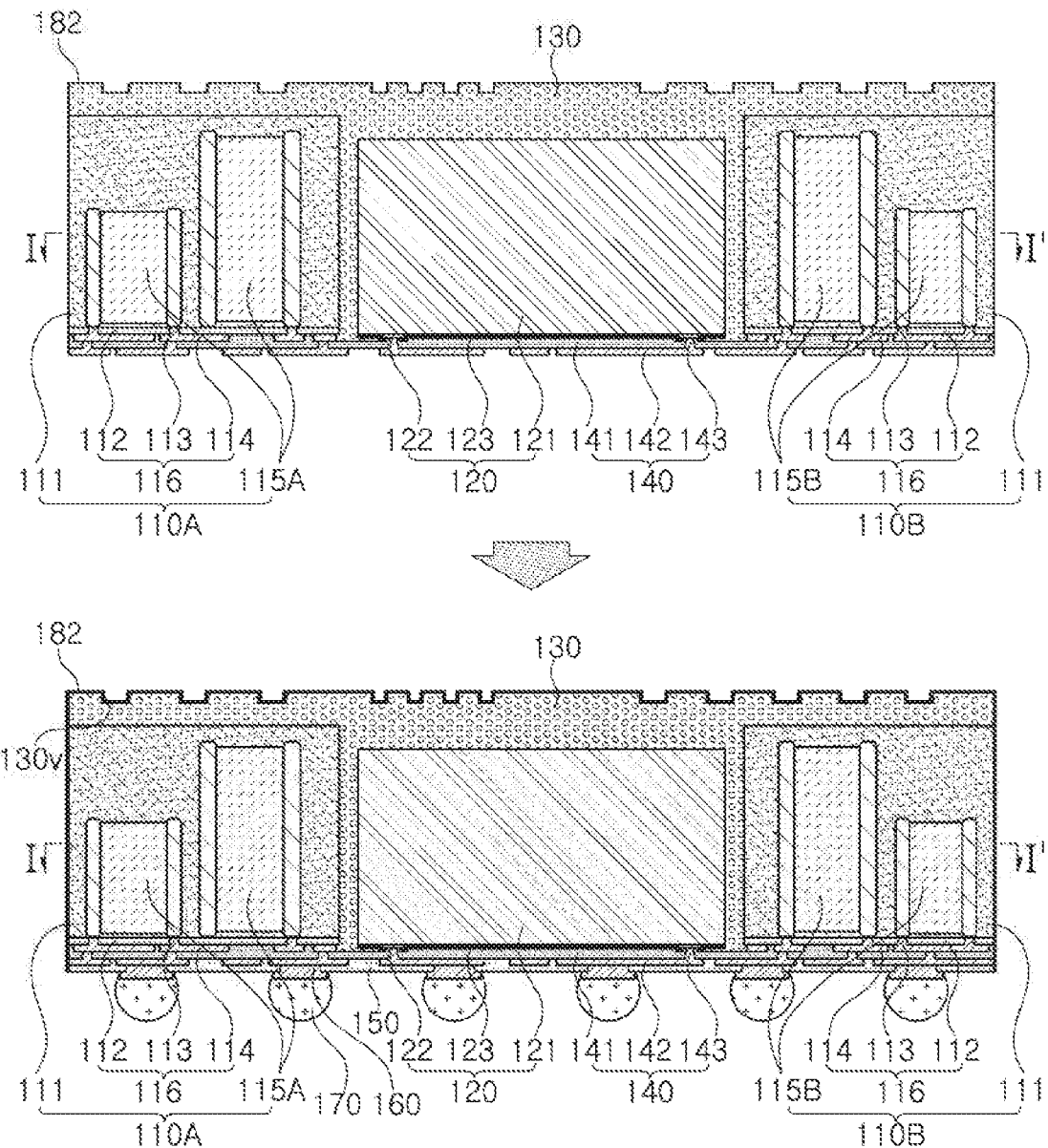
FIG. 15 is a process diagram illustrating an example of a process of manufacturing a semiconductor package.

FIG. 15 is a process diagram illustrating an example of a process of manufacturing a semiconductor package.

Referring to the diagram, in a semiconductor package 100B in the example embodiment, a first metal layer 181 may be completely removed by a full etching process, and only a second metal layer 182 may remain, as compared to the semiconductor package 100A described in the aforementioned example embodiment. Thus, the second metal layer 182 may fill at least a portion of each of the recessed portions 130v, and may cover an upper surface and side surfaces of the first encapsulant 130. Even through the first metal layer 181 is completely removed, a surface roughness of an upper surface of the first encapsulant 130 and a wall and a bottom surface of each of the recessed portions 130v may increase due to the transcribed roughness, and thus, adhesive strength with the second metal layer 182 may still be implemented. The descriptions of the other elements are the same as the descriptions described with reference to FIGS. 9 to 13, and thus, the detailed descriptions thereof will not be repeated.

Figure 16:
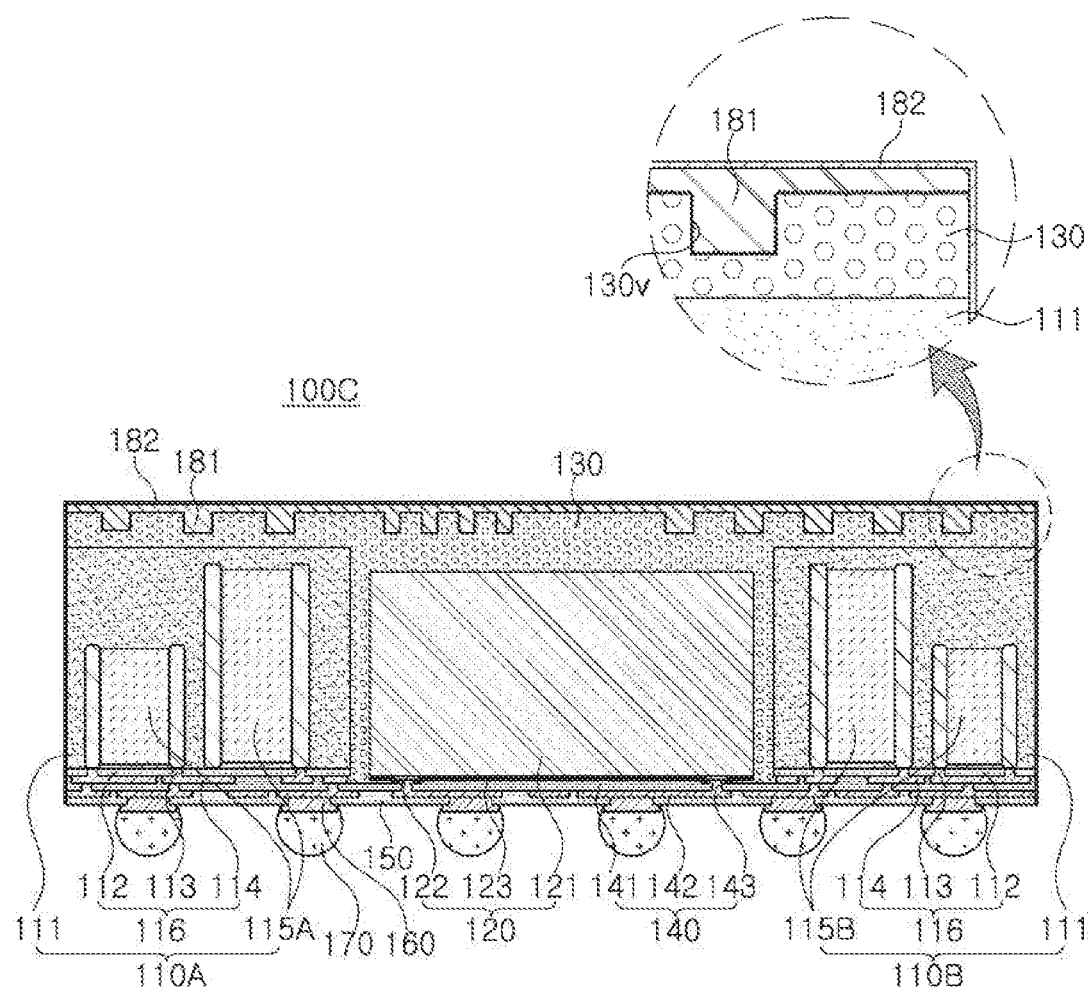
FIG. 16 is a schematic cross-sectional diagram illustrating another example of a semiconductor package.

FIG. 16 is a schematic cross-sectional diagram illustrating another example of a semiconductor package.

Figure 17:
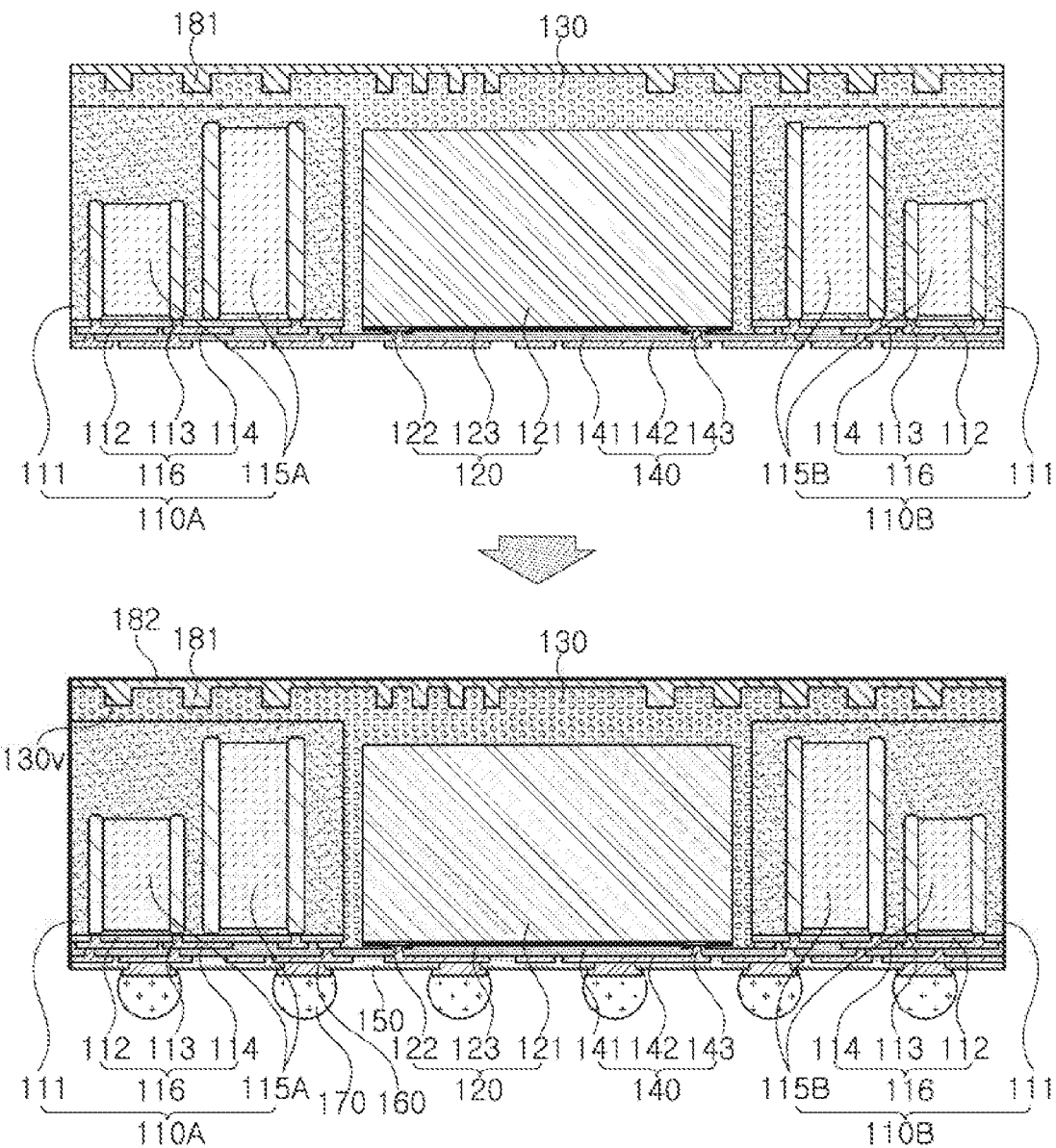
FIG. 17 is a process diagram illustrating an example of a process of manufacturing a semiconductor package illustrated in FIG. 16.

FIG. 17 is a process diagram illustrating an example of a process of manufacturing a semiconductor package illustrated in FIG. 16.

Referring to the diagram, in a semiconductor package 100C in another example embodiment, an etching process may be performed more locally to remove only a portion of the first metal layer 181 such that a first metal layer 181 may remain while covering an upper surface of a first encapsulant 130, as compared to the semiconductor package 100A described in the aforementioned example embodiment. If desired, an etching process may not be performed. In the example embodiment, the first metal layer 181 may fill each of the recessed portions 130v, may cover an upper surface of the first encapsulant 130, and a second metal layer 182 may cover the first metal layer 181 and side surfaces of the first encapsulant 130. In this case, a surface of the first metal layer 181 in contact with the first encapsulant 130 may have a roughness greater than a surface roughness of a surface of the first metal layer 181 in contact with the second metal layer 182, and the first metal layer 181 may fill the recessed portions 130v, and thus, the first metal layer 181 may be in contact with the first encapsulant 130 with improved adhesive strength. Further, as the second metal layer 182 is formed on the first metal layer 181, the second metal layer 182 may be in contact with the first metal layer 181 with improved adhesive strength as the same or similar metals are bonded to each other. The descriptions of the other elements are the same as the descriptions described with reference to FIGS. 9 to 13, and thus, the detailed descriptions thereof will not be repeated.

Figure 18:
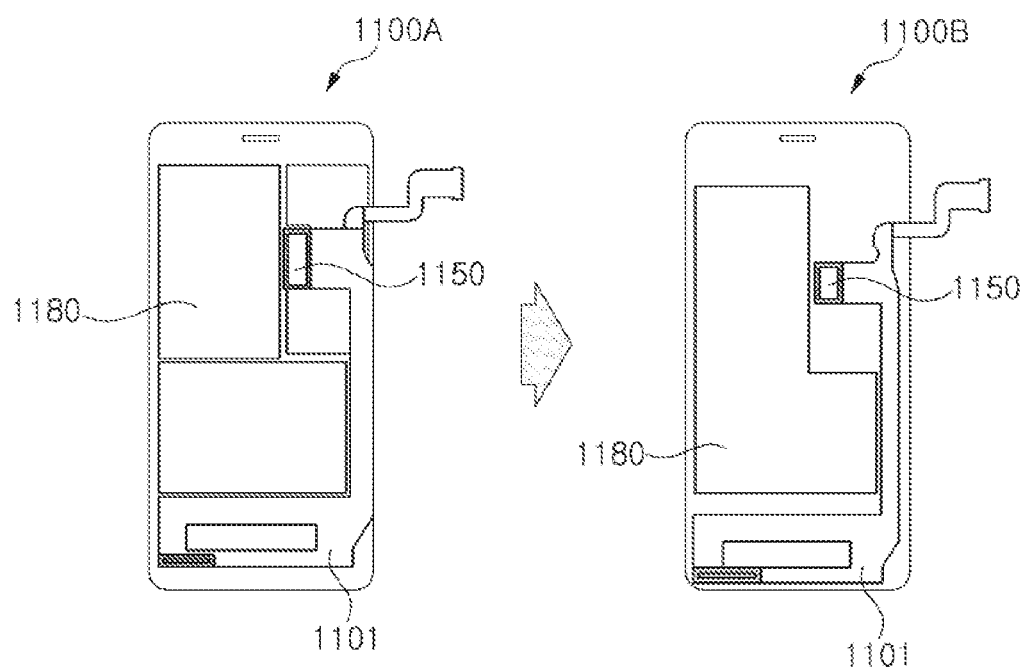
FIG. 18 is a schematic plan diagram illustrating an effect of an example in which a semiconductor package is applied to an electronic device.

FIG. 18 is a schematic plan diagram illustrating an effect of an example in which a semiconductor package is applied to an electronic device.

Referring to the diagram, as a size of a display used for a mobile device 1100A and 1100B is increased, it may be necessary to increase battery capacity. When battery capacity increases, an area occupied by a battery 1180 may increase, and a size of a printed circuit board 1101 such as a mainboard may need to be reduced. Accordingly, amounting area for components may need to be decreased, and an area occupied by a module 1150 including a PMIC and passive components may also be reduced. When the semiconductor package 100A, 100B, and 100C described in the example embodiments are applied as in the module 1150, the sizes may be significantly reduced, and the reduced areas described above may be used in an effective manner.

According to the aforementioned example embodiments, a semiconductor package having a metal layer for shielding electromagnetic waves with improved adhesive strength may be provided. Also, a marking pattern for identification may be included in the semiconductor package.

In the example embodiments, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. A semiconductor package, comprising:
 a semiconductor chip having an active surface on which a connection pad is disposed and an inactive surface opposing the active surface;
 a first encapsulant covering at least a portion of each of the inactive surface and side surfaces of the semiconductor chip, and having one or more recessed portions recessed towards the inactive surface of the semiconductor chip;
 a metal layer disposed on the first encapsulant, and filling at least a portion of each of the recessed portions; and
 an interconnect structure disposed on the active surface of the semiconductor chip, and including a redistribution layer electrically connected to the connection pad,
 wherein a surface of the metal layer in contact with the first encapsulant has a surface roughness greater than a surface roughness of a surface of the metal layer spaced apart from the first encapsulant.

2. The semiconductor package of claim 1,
 wherein the metal layer covers an upper surface of the first encapsulant,
 wherein a surface of the metal layer in contact with an upper surface of the first encapsulant has a surface roughness greater than a surface roughness of a surface of the metal layer opposing the surface in contact with the upper surface of the first encapsulant.

3. The semiconductor package of claim 2,
 wherein the metal layer covers the upper surface and side surfaces of the first encapsulant, and
 wherein a surface of the metal layer in contact with the upper surface of the first encapsulant has a surface roughness greater than a surface roughness of a surface of the metal layer in contact with the side surfaces of the first encapsulant.

4. The semiconductor package of claim 1, wherein at least one of the recessed portions includes a marking pattern for identification.

5. The semiconductor package of claim 1,
 wherein the metal layer includes a first metal layer filling at least a portion of each of the recessed portions, and a second metal layer disposed on the first metal layer, filling at least the other portion of each of the recessed portions, and covering an upper surface and side surfaces of the first encapsulant, and
 wherein a boundary between the first and second metal layers is distinct.

6. The semiconductor package of claim 5, wherein a surface of the first metal layer in contact with the first encapsulant has a surface roughness greater than a surface roughness of a surface of the first metal layer in contact with the second metal layer.

7. The semiconductor package of claim 5, wherein a surface of the second metal layer in contact with an upper surface of the first encapsulant has a surface roughness greater than a surface roughness of a surface of the second metal layer in contact with the first metal layer.

8. The semiconductor package of claim 1,
wherein the metal layer includes a first metal layer filling the recessed portions and covering an upper surface of the first encapsulant, and a second metal layer covering the first metal layer and side surfaces of the first encapsulant, and
wherein a boundary between the first and second metal layers is distinct.

9. The semiconductor package of claim 8, wherein a surface of the first metal layer in contact with the first encapsulant has a surface roughness greater than a surface roughness of a surface of the first metal layer in contact with the second metal layer.

10. The semiconductor package of claim 1, further comprising:
one or more component embedded structures disposed on the interconnect structure and disposed in parallel to the semiconductor chip, and including one or more passive components embedded therein,
wherein the first encapsulant covers at least a portion of each of the component embedded structures.

11. The semiconductor package of claim 10,
wherein the component embedded structures each include the one or more passive components, a second encapsulant encapsulating each of the passive components, and a wiring structure disposed in a lower portion of each of the passive components and including a wiring layer electrically connected to each of the passive components, and
wherein the wiring layer is electrically connected to the connection pad through the redistribution layer.

12. The semiconductor package of claim 11, wherein a stepped portion is formed between a lower surface of each of the passive components and the active surface of the semiconductor chip.

13. The semiconductor package of claim 11, wherein a lower surface of the wiring layer is coplanar with the active surface of the semiconductor chip.

14. The semiconductor package of claim 1, wherein the semiconductor package is a fan-out semiconductor package.

15. The semiconductor package of claim 1, wherein the metal layer extends from an upper surface of the first encapsulant to cover a side surface of the first encapsulant and a side surface of the interconnect structure.

16. The semiconductor package of claim 15, wherein the metal layer is in contact with a ground pattern of the redistribution layer exposed from the side surface of the interconnect structure.

* * * * *